US012532399B2

(12) United States Patent
Reichert et al.

(10) Patent No.: US 12,532,399 B2
(45) Date of Patent: Jan. 20, 2026

(54) HIGH-VOLTAGE GENERATOR DEVICE, X-RAY GENERATOR AND METHOD FOR MANUFACTURING A HIGH-VOLTAGE GENERATOR DEVICE

(71) Applicant: Comet AG, Flamatt (CH)

(72) Inventors: Aaron Reichert, Faoug (CH); Johannes Zenner, Courtepin (CH); Michael Freiburghaus, Rüfenacht (CH)

(73) Assignee: Comet AG, Flamatt (CH)

( * ) Notice: Subject to any disclaimer, the term of this patent is extended or adjusted under 35 U.S.C. 154(b) by 129 days.

(21) Appl. No.: 18/371,416

(22) Filed: Sep. 21, 2023

(65) Prior Publication Data

US 2024/0098865 A1 Mar. 21, 2024

(30) Foreign Application Priority Data

Sep. 21, 2022 (EP) .................................. 22196950

(51) Int. Cl.
*H05G 1/32* (2006.01)
*H05G 1/02* (2006.01)
*H05G 1/10* (2006.01)

(52) U.S. Cl.
CPC ................. *H05G 1/32* (2013.01); *H05G 1/02* (2013.01); *H05G 1/10* (2013.01)

(58) Field of Classification Search
CPC .............. H05G 1/32; H05G 1/02; H05G 1/10
See application file for complete search history.

(56) References Cited

U.S. PATENT DOCUMENTS

| 4,041,366 A * | 8/1977 | Bauer | H02M 7/106 363/61 |
|---|---|---|---|
| 5,497,409 A | 3/1996 | Jedlitschka et al. | |
| 6,060,791 A * | 5/2000 | Goerz | H03K 3/53 361/326 |
| 2005/0117707 A1* | 6/2005 | Baier | G21K 1/04 378/156 |
| 2005/0190883 A1 | 9/2005 | Suzuki et al. | |

(Continued)

FOREIGN PATENT DOCUMENTS

| DE | 102 46 548 A1 | 4/2004 |
|---|---|---|
| DE | 10 2006 054 057 B4 | 5/2008 |

(Continued)

OTHER PUBLICATIONS

Search Report issued by the German Patent and Trademark Office for German Patent Application No. 10 2023 125 593.2, dated Jun. 6, 2024.

(Continued)

*Primary Examiner* — Hugh Maupin
(74) *Attorney, Agent, or Firm* — Bradley Arant Boult Cummings LLP; Henry B. Ward, III

(57) ABSTRACT

A high-voltage generator device is provided comprising an electric field shaper for shaping an electric field, in particular for a high-voltage generator. The electric field shaper comprising at least one field shaping unit which has a field shaping element. The field shaping element comprises a non-conductive body, in particular a plastic body, and an electrically conductive coating that is arranged on the non-conductive body.

19 Claims, 4 Drawing Sheets

(56) References Cited

U.S. PATENT DOCUMENTS

| | | | | |
|---|---|---|---|---|
| 2009/0010393 A1* | 1/2009 | Klinkowstein | .......... | H05G 1/06 |
| | | | | 378/140 |
| 2009/0185660 A1* | 7/2009 | Zou | ...................... | H01J 1/3048 |
| | | | | 378/138 |
| 2012/0262959 A1* | 10/2012 | Hanington | ............... | H01G 4/38 |
| | | | | 363/61 |
| 2015/0124934 A1* | 5/2015 | Gupta | ................... | G01N 23/041 |
| | | | | 378/143 |

FOREIGN PATENT DOCUMENTS

| | | |
|---|---|---|
| DE | 10 2013 226 463 A1 | 2/2014 |
| KR | 1020170111796 A | 10/2017 |

OTHER PUBLICATIONS

European Search Report issued on Apr. 25, 2023, for European Patent Application 22196950.4.
"Versilbern—Wikipedia", Dec. 10, 2021 XP093015044 Retrieved from the Internet: URL: https://de.wikipedia.org/w/indexphp?title=Versilbern&oldid=218055953.
"Kunststoffmetallisierung—Wikipedia", Jan. 11, 2021, pp. 1-4, XP0930146446 Retrieved from the Internet: URL: https://de.wikipedia.org/wiki/Kunststoffmetallisierung.

\* cited by examiner

HIGH-VOLTAGE GENERATOR DEVICE, X-RAY GENERATOR AND METHOD FOR MANUFACTURING A HIGH-VOLTAGE GENERATOR DEVICE

BACKGROUND OF THE INVENTION

A high-voltage generator device comprising an electric field shaper for shaping an electric field, the electric field shaper comprising at least one field shaping unit which has a field shaping element, has already been proposed.

The task of the invention is, in particular, to provide a high-voltage generator comprising an electric field shaper with improved properties with regard to any of weight, costs, robustness, form and/or heat stability and construction flexibility.

According to the invention, the task is solved by the features a high-voltage generator device comprising an electric field shaper for shaping an electric field, the electric field shaper comprising at least one field shaping unit, which has a field shaping element; and wherein the field shaping element comprises a non-conductive plastic body and an electrically conductive coating that is arranged on the non-conductive body. In one embodiment, the electrically conductive coating covers the non-conductive body at least substantially completely. In another embodiment, the electrically conductive coating comprises several electrically conductive metal layers. In another embodiment, the electrically conductive coating comprises at least one copper layer for receiving an electric charge. In another embodiment, the electrically conductive coating comprises at least one nickel layer for bonding the non-conductive body to an electrically conductive layer of the electrically conductive coating or for bonding an electrically conductive layer of the electrically conductive coating to a further electrically conductive layer of the electrically conductive coating. In another embodiment, the electrically conductive coating comprises at least one layer containing chromium for scratch protection. In another embodiment, the field shaping unit comprises an at least substantially uniform outward-facing surface. In another embodiment, the field shaping element comprises at least one elastic connection element, which is arranged on an inner side of the field shaping unit for fastening of an electric component. In another embodiment, the absolute value of an electric potential of the electrically conductive coating is in an operation state at least 100 V. In another embodiment, the field shaping unit comprises a further field shaping element, which has a further non-conductive body and a further electrically conductive coating that is arranged on the further non-conductive body, wherein the field shaping element and the further field shaping element are attachable to each other. In another embodiment, the non-conductive body consists at least partially of a polycarbonate acrylonitrile butadiene styrene mixture. In another embodiment, an inside of the field shaping element is free from any electric and/or electronic components.

The invention also includes an X-Ray generator comprising a high-voltage generator device comprising an electric field shaper for shaping an electric field, the electric field shaper comprising at least one field shaping unit, which has a field shaping element; and wherein the field shaping element comprises a non-conductive plastic body and an electrically conductive coating that is arranged on the non-conductive body.

The invention also includes a method for manufacturing a high-voltage generator device comprising providing an electric field shaper for shaping an electric field, the electric field shaper comprising at least one field shaping unit, which has a field shaping element comprising a non-conductive body; and applying an electrically conductive coating to the non-conductive body. In one embodiment, the method comprises mounting the field shaping element to an electric component.

BRIEF SUMMARY OF THE INVENTION

The invention is based on a high-voltage generator device comprising an electric field shaper for shaping an electric field, in particular for a high-voltage generator, the electric field shaper comprising at least one field shaping unit which has a field shaping element.

It is proposed that the filed shaping element comprises a non-conductive body, preferably a plastic body, and an electrically conductive coating that is arranged on the non-conductive body.

It is advantageously possible to provide a high-voltage generator device comprising an electric field shaper with particularly low material costs. Advantageously, an electric field shaper with a particularly low weight can be provided. It is therefore possible to realize a particularly light weight high-voltage generator device. The construction of the electric field shaper according to the invention enables especially complex shapes of the field shaping element. A particularly high flexibility can be achieved with regard to design options. Advantageously, an electric field can be adapted particularly precisely to requirements. It is advantageously possible to achieve a particularly effective shaping of the electric field. Thereby, a particularly high degree of flexibility can be achieved with regard to the construction options of a high-voltage generator.

The field shaping unit, in particular the field shaping element, is preferably configured to shape an electric field of a high-voltage generator, in particular a high-voltage generator of an x-ray generator. Preferably, the field shaping unit, in particular the field shaping element, is configured to counteract a local exceeding of a predetermined limit value of an electric field strength of the electric field, in particular by shaping the electric field. In particular, "configured" shall be understood to mean specially programmed, implemented and/or equipped. By the term that an object is configured to perform a certain function, it shall be understood in particular that the object fulfills and/or executes this certain function in at least one application and/or operation state.

The electrically conductive coating is particularly implemented integrally with the non-conductive body. "Implemented integrally" is in particular to mean connected at least by a substance-to-substance bond, for example by a gluing process, a physical vapor deposition process, a chemical vapor deposition process, a thermal spraying process, an electroplating process and/or another process that is deemed expedient by someone skilled in the art. Preferably, the electrically conductive coating is not a paint and/or varnish.

In particular, the electrically conductive coating consists at least partially of an electrically conductive material. The term "at least partially" is here in particular to mean at least 10%, preferably at least 25% and particularly preferably at least 50% of a total volume and/or a total mass of an object, in particular of the electrically conductive coating. Preferably, the electrically conductive coating consists at least substantially completely of an electrically conductive material or several electrically conductive materials. The term "substantially completely" is here in particular to mean at least 60%, preferably at least 75%, particularly preferred at least 90% and very particularly preferred at least 99% of a total volume, a total surface and/or a total mass of an object, in particular of the electrically conductive coating.

By an electrically conductive element or material is herein in particular an object or a material to be understood which has an electrical conductivity which is greater than $5 \cdot 10^{-6}$ S/m, preferably greater than $1 \cdot 10^5$ S/m in particular at 0° C. Preferably the electrically conductive coating has an electrical conductivity which is greater than $5 \cdot 10^{-6}$ S/m, particularly preferable greater than $1 \cdot 10^5$ S/m in particular at 0° C. For example, the electrically conductive coating consists for example only of the electrically conductive material. Alternatively, it is also conceivable that the electrically conductive coating consists of several electrically conductive materials. It is conceivable that the electrically conductive coating comprises at least one electrically non-conductive material in addition to the at least one electrically conductive material. By an electrically non-conductive object or material is herein in particular an element or a material to be understood which has an electrical conductivity of maximum $5 \cdot 10^{-6}$ S/m in particular at 0° C.

The non-conductive body consists in particular at least partially, preferably at least substantially completely, of an electrically non-conductive material. It is conceivable that the non-conductive body is formed from one material or from multiple materials. It is also conceivable that the non-conductive body consists at least partially of an electrically conductive material. For example, it is conceivable that the non-conductive body comprises electrically conductive particles or the like. The non-conductive body consists preferably at least partially of a plastic, particularly at least substantially completely of a plastic. Alternatively, it is also conceivable that the non-conductive body consists at least partially of an engineered wood, for example paper, cardboard, plywood, densified wood, fiberboard, particle board or the like or another non-conductive material.

It is conceivable that the field shaping unit comprises only the field shaping element. Alternatively, it is also conceivable that the field shaping unit comprises at least one further field shaping element or alternatively a multitude of field shaping elements, in particular more than two field shaping elements. Preferably, the field shaping element and the further field shaping element are configured to work together to shape the electric field. The field shaping element can be implemented ring-shaped, in particular circle-shaped, plug-like or the like.

It is further proposed that the electrically conductive coating covers the non-conductive body at least substantially completely. It is advantageously possible to provide a particularly lightweight and at the same time particularly efficient electric field shaper. Advantageously, an electric field shaper can be realized that is particularly effective in counteracting the formation of undesirable field strength peaks in the electric field. A particularly light weight electric field shaper can be provided that can support the generation of a particularly uniform electric field. Advantageously, a local exceeding of a predetermined limit value for the electric field strength can be counteracted particularly effectively. Particularly preferred, the electrically conductive coating covers the non-conductive body completely.

Moreover, it is proposed that the electrically conductive coating comprises several electrically conductive layers, in particular several metal layers. A particularly high adaptability to different requirements can be achieved by using several conductive layers. Advantageously, the electric field shaper can be adapted particularly precisely to different requirements. It is advantageously possible to provide a particularly efficient field former. Alternatively, however, it is also conceivable that the electrically conductive coating comprises only one electrically conductive layer. It is conceivable that the electrically conductive layers consist at least partially of different materials and/or that the electrically conductive layers have different material compositions. Alternatively, it is also conceivable, that the electrically conductive layers consist at least substantially of identical materials and/or that the electrically conductive layers have at least substantially identical material compositions. Here, the term "at least substantially identical" is in particular to be understood as identical except for production-related differences. Particularly preferably, the electrically conductive coating is implemented as a metal coating. Preferably, the electrically conductive layers are metal layers. Particularly preferable, the electrically conductive coating is formed by the several electrically conductive layers or alternatively by the only one electrically conductive layer. Alternatively or additionally, it is conceivable that the electrically conductive coating comprises at least one electrically non-conductive layer. Preferably each of the several electrically conductive layers covers the non-conductive body at least substantially completely. The electrically conductive layers are arranged on top of each other. At least one electrically conductive layer of the several electrically conductive layers lies in particular directly against the non-conductive body. At least one further electrically conductive layer of the electrically conductive layers is in particular arranged at a distance from the non-conductive body. Preferably, at least one of the electrically conductive layers covers at least one further electrically conductive layer of the electrically conductive layers at least substantially completely. Alternatively, it is also conceivable that at least one of the several electrically conductive layers is at least partially free from being covered, in particular by an electrically conductive layer. Coatings do not have to be applied everywhere. E.g., a copper coating may be left bare, where it needs to contact a PCB, while it is covered on other locations by a layer containing chromium for robustness.

It is further proposed that the electrically conductive coating comprises at least one copper layer for receiving an electric charge. A particularly electrically conductive surface of the field shaping element can be realized. It is advantageously possible to counteract a burn-through of a nickel layer arranged on the copper layer. Advantageously, a particularly efficient adhesion of the electrically conductive coating on the non-conductive body can be achieved. The copper layer lies in particular directly against the non-conductive body. The copper layer is preferably at least configured to compensate for possible unevenness of a surface of the non-conductive body on which in particular the copper layer is arranged. The copper layer has in particular a thickness of at least 15 µm. The copper layer preferably has a thickness between 15 µm and 25 µm. Alternatively, it is also conceivable that the copper layer has a thickness smaller than 15 µm or greater than 25 µm.

Moreover, it is proposed that the electrically conductive coating comprises at least one, in particular the already aforementioned, nickel layer for bonding the non-conductive body to an electrically conductive layer of the electrically conductive coating or for bonding an electrically conductive layer of the electrically conductive coating to a further electrically conductive layer of the electrically conductive coating. A particularly scratch-resistant field shaping element can be provided. Advantageously, a field shaping element with particularly high corrosion protection can be provided. It is advantageously possible to provide a robust, durable and at the same time light weight and easy to manufacture field shaping element. The nickel layer is intended as a corrosion protection, for example. In particular, the copper layer is arranged between the non-conductive body and the nickel layer. The nickel layer preferably covers the copper layer and the non-conductive body at least substantially completely. The nickel layer lies in particular directly against the copper layer. The nickel layer has in particular a thickness of at least 5 µm. The nickel layer preferably has a thickness between 5 µm and 15 µm. Alternatively, it is also conceivable that the nickel layer has a thickness smaller than 5 µm or greater than 15 µm.

Furthermore, it is proposed that the electrically conductive coating comprises at least one layer containing chromium for scratch protection. It is advantageously possible to provide a particularly light weight field shaping element with a particularly high surface hardness. Advantageously, a particularly high scratch resistance of a surface of the field shaping element can be achieved. A light weight but nevertheless particularly robust field shaping element can be realized. It is possible to achieve a particularly high level of operational reliability. It is conceivable that the layer containing chromium consists partially of chromium or at least substantially completely, particularly preferred completely, of chromium. Preferably, the layer containing chromium is different from the nickel layer and/or the copper layer. Alternatively, it is also conceivable that the layer containing chromium corresponds to the nickel layer or to the copper layer. In particular, the layer containing chromium is the outermost layer of the electrically conductive coating, preferably when viewed from the non-conductive body. The nickel layer and/or the copper layer are/is in particular arranged between the non-conductive body and the layer containing chromium. The layer containing chromium preferably covers the copper layer, the nickel layer and/or the non-conductive body at least substantially completely. The layer containing chromium lies in particular directly against the nickel layer. The layer containing chromium has in particular a thickness of at least 0.1 µm. The layer containing chromium preferably has a thickness between 0.1 µm and 0.5 µm. Alternatively, it is also conceivable that the layer containing chromium has a thickness smaller than 0.1 µm or greater than 0.5 µm.

Beyond this it is proposed that the field shaping unit comprises an at least substantially uniform outward-facing surface. Advantageously, a local exceeding of an electric field strength of an electric field can be counteracted particularly efficiently. Preferably the outward-facing surface of the field shaping unit is formed without edges. Particularly preferred, the outward-facing surface of the field shaping unit is free of protrusions and/or recesses that are visible to the naked eye. At least a part of an outward-facing surface of the field shaping element corresponds to at least a part of the outward-facing surface of the field shaping unit. It is also conceivable, that the outward-facing surface of the field shaping element corresponds to the outward-facing surface of the field shaping unit. The outward-facing surface in particular is arranged on a side of the field shaping unit facing away from a geometric center of the field shaping unit, preferably at least in an operation state. It is conceivable that the outward-facing surface of the field shaping element is at least substantially uniform. Preferably the outward-facing surface of the field shaping element is in at least one operation state, at least substantially uniform. Alternatively, it is also conceivable that the outward-facing surface of the field shaping element is different from the outward-facing surface of the field shaping unit, in particular in at least one embodiment of the invention, in which the field shaping unit comprises the field shaping element and the further field shaping element. The outward-facing surface of the field shaping unit, which comprises the field shaping element and the further field shaping element, is at least substantially uniform in a state in which the field shaping element and the further field shaping element are attached to each other and/or in which the field shaping element and the further field shaping element are attached to an electric component. It is also conceivable that the field shaping unit comprises in particular an at least substantially uniform outward facing surface except for a transition area between the field shaping element and the further field shaping element in a state of being attached to each other and/or to the electric component.

It is further proposed that the field shaping element comprises at least one elastic connection element for fastening of an, in particular the already aforementioned, electric component. Advantageously, a particularly simple and effective fastening can be realized. The elastic connection element is in particular configured to be deflected for fastening of the electric component. Preferably the elastic connection element is configured to be elastically deformed for fastening of the electric component. The elastic connection element in particular is formed by a part of the non-conductive body and a part of the electrically conductive coating. For example, the elastic connection element can be implemented as a latching element, in particular as a snap-in nose, as a latching hook or the like, as an elastic clamping element or the like. Alternatively, or additionally, it is also conceivable that the field shaping element comprises at least one rigid connection element for fastening of the electric component. The rigid connection element is in particular configured for a deflection-free fastening, with respect to the rigid connection element, of the electric component. The rigid connection element in particular is formed by a part of the non-conductive body and a part of the electrically conductive coating. The rigid connection element can be implemented as a latching element, in particular as a latching hook or the like, for example as a latching element of a bayonet mount, as a recess or the like. For example, the electric component can be implemented as the further field shaping element, as a printed circuit board or as any other electric component that appears reasonable to a person skilled in the art. Preferably the elastic connection element and/or the rigid connection element are/is arranged on a side of the electric field shaping element which corresponds to a low electric field strength side of the field shaping element at least in an operation state. A maximum potential difference on the low electric field strength side is for example maximum 50 kV. Alternatively, it is also conceivable that a maximum value of a maximum potential difference on the low electric field strength side is different from 50 kV, for example smaller or larger. The elastic connection element and/or the rigid connection element in particular are/is arranged in such a way that in at least one operation state an electric potential in an area in which the elastic connection element and/or the rigid connection element are/is arranged is at least substantially constant in that operation state. By "at least substantially constant" is herein in particular to be understood that a deviation from a mean value of a parameter is no more than 10%, preferably no more than 5%, particularly preferred no more than 1%, of the mean value of the parameter.

It is moreover proposed that the elastic connection element is arranged on an inner side of the field shaping unit, in particular on an inner side of the field shaping element.

The inner side of the field shaping unit preferably corresponds to the low electric field strength side of the field shaping unit. The inner side of the field shaping unit is in particular different from a side on which the outward-facing surface of the field shaping unit is arranged. The outward-facing surface of the field shaping unit can be arranged on a side of the field shaping unit that corresponds to a high electric field strength side of the field shaping unit, preferably in at least one operation state. On the low electric field strength side, preferably on the inner side, the electric field strength of the electric field is in particular in at least one operation state relatively low compared to the high electric field strength side, particularly preferred the side on which the outward-facing surface of the field shaping unit is arranged. It is conceivable that an outer side of the field shaping element is arranged on the inner side of the field shaping unit, at least in an operation state in which for example the field shaping element and the further field shaping element are attached to each other. Alternatively, it is also conceivable that the inner side of the field shaping element corresponds to at least part of the inner side of the field shaping unit.

Furthermore, it is proposed that the field shaping unit comprises a, in particular the already aforementioned, further field shaping element, which has a further non-conductive body and a further electrically conductive coating that is arranged on the further non-conductive body, wherein the field shaping element and the further field shaping element are attachable to each other. A particularly simple assembly of the electric field shapers can be achieved. Advantageously, electric components can easily be clamped between the field shaping element and the further field shaping element for fastening. Additional fastening parts can be dispensed with. In particular, the field shaping element and the further field shaping element are at least in one operation state attached to each other to shape the electric field. In particular, the field shaping element is formed corresponding to the further field shaping element. It is conceivable that the field shaping element and the further field shaping element are detachably, in particular non-destructively detachably, attachable to each other. Preferably, a material composition of the further non-conductive body corresponds to a material composition of the non-conductive body. Alternatively, it is also conceivable that the material composition of the further non-conductive body is different from the material composition of the non-conductive body. In particular, a material composition of the further electrically conductive coating corresponds to a material composition of the electrically conductive coating. Alternatively, it is also conceivable that the material composition of the further electrically conductive coating is different from the material composition of the electrically conductive coating. It is conceivable that thicknesses of electrically conductive layers of the further electrically conductive coating are identical to or different from thicknesses of the corresponding electrically conductive layers of the electrically conductive coating. It is conceivable that the further field shaping element comprises at least one elastic connection element for fastening of the field shaping element. In particular, the elastic connection element of the further field shaping element is implemented correspondingly to the elastic connection element of the field shaping element and/or the rigid connection element of the field shaping element. Preferably, the elastic connection element of the further field shaping element is configured to work together with the elastic connection element of the field shaping element and/or the rigid connection element of the field shaping element for fastening the field shaping element and the further field shaping element to each other and/or to the electric component. Additionally, or alternatively, it is also conceivable that the further field shaping element comprises at least one rigid connection element for fastening of the field shaping element. In particular, the rigid connection element of the further field shaping element is implemented correspondingly to the elastic connection element of the field shaping element and/or the rigid connection element of the field shaping element. Preferably, the rigid connection element of the further field shaping element is configured to work together with the elastic connection element of the field shaping element and/or the rigid connection element of the field shaping element for fastening the field shaping element and the further field shaping element to each other and/or to the electric component. It is conceivable that a pulling action between the field shaping element and the electric component, in particular the further field shaping element, can be generated at least partially by the elastic connection element and/or by the rigid connection element when fastening the electric component.

Moreover, it is proposed that the non-conductive body consists at least partially, in particular substantially completely, of a polycarbonate acrylonitrile butadiene styrene mixture. Advantageously, a particularly cost-effective and at the same time robust field shaping element can be realized. Preferably, the non-conductive body consists completely of a polycarbonate acrylonitrile butadiene styrene mixture. In particular, the further non-conductive body consists at least partially, preferably at least substantially completely, of a polycarbonate acrylonitrile butadiene styrene mixture. Alternatively, or additionally, it is also conceivable that the non-conductive body and/or the further non-conductive body consist/s at least partially of another plastic, in particular one that is different from a polycarbonate acrylonitrile butadiene styrene mixture.

The high-voltage generator device is in particular part of the high-voltage generator. The high-voltage generator device comprises at least a voltage multiplier unit. The voltage multiplier unit comprises in particular at least one Greinacher circuit, in particular to convert a supplied AC voltage into a high DC voltage. Preferably, the Greinacher circuit is arranged on the inner side, in particular on the low electric field strength side, of the field shaping unit of the electric field shaper. The field shaping element of the electric field shaper at which the Greinacher circuit is arranged is preferably implemented as a circle-shaped electric field shaping element. The Greinacher circuit is preferably electrically connected to the field shaper, particularly preferred on the inner side of the field shaping unit. In particular, the high-voltage generator device comprises several Greinacher circuits. Preferably, the Greinacher circuits form a cascade, in particular to convert a supplied AC voltage into a high DC voltage. Preferably, the high-voltage generator device comprises several of the electric field shapers. In particular, a number of the electric field shapers corresponds to a number of Greinacher circuits. It is conceivable that the high-voltage generator comprises at least one additional field shaper, preferably a multitude of additional electric field shapers. An electric field shaping unit of the additional electric field shaper comprises in particular a first field shaping element and a second field shaping element. The first field shaping element and the second field shaping element are preferably implemented as corresponding plug parts. The high-voltage generator device comprises at least one printed circuit board. The printed circuit board comprises in particular at least one recess to accommodate the at least one additional field shaper, preferably a multitude of recesses to accommodate the multitude of additional electric field shapers. The printed circuit board comprises in particular at least one electrically conductive component, which is preferably electrically connected to the additional field shaper. In particular, the description of the electric field shaper, except for differences described, applies analogously to the additional field shaper.

Furthermore, it is proposed that the absolute value of an electric potential of the electrically conductive coating is in an operation state at least 100 V, in particular at least 1 kV and preferably at least 10 kV, whereby the electric field can be reliably shaped in the vicinity of components having a similar or the same electric potential. In particular, the electrically conductive coatings of the field shaping elements each are on the same electric potential as one of the stages, in particular Greinacher circuits, of the voltage multiplier unit, each stage of the voltage multiplier unit in particular being assigned to one of the field shaping elements and/or electrically conductive coatings. The absolute value of the electric potential(s) of the electrically conductive coating(s) can therefore be up to 50 kV in the operation state.

It is further proposed that an inside of the field shaping element is free from any electric and/or electronic components, whereby a simple construction can be achieved. In particular, the inside of the field shaping element is free from any high-voltage generating parts which are, in particular, intended for generating a high-voltage, in particular parts of the voltage multiplier unit. Therein, the "inside" of the field shaping element is to mean a region that is at least partly surrounded by an outer wall of the field shaping element. The "inside" could be a region that is at least partly and possibly completely embedded in the material of the field shaping element or a region that is at least partly and possibly completely surrounded by the field shaping element.

Furthermore, an x-ray generator comprising a high-voltage generator device according to the invention is proposed. Advantageously, a local exceeding of a predetermined limit value for the electric field strength can be counteracted particularly effectively. A particularly high operational reliability of the generator can be achieved. It is advantageously possible to realize a weight saving in combination with a particularly high construction flexibility. The x-ray generator comprises in particular the high-voltage generator. The x-ray generator comprises preferably an x-ray tube. The high-voltage generator is preferably configured to supply the x-ray tube with a high-voltage.

The invention is furthermore based on a method for manufacturing a high-voltage generator device comprising an electric field shaper, in particular the aforementioned electric field shaper, for shaping an electric field, in particular for a, in particular the already aforementioned, high-voltage generator, the electric field shaper comprising at least one, in particular the already aforementioned, field shaping unit which has a, in particular the already aforementioned, field shaping element. It is proposed that the field shaping element comprises a, in particular the already aforementioned, non-conductive body to which an, in particular the already aforementioned, electrically conductive coating is applied. It is advantageously possible to provide an electric field shaper with particularly low material costs. An electric field shaper with a particularly low weight can be provided. The implementation of the electric field shaper according to the invention enables especially complex shapes of the field shaping element. In particular, in one process step the electrically conductive coating is applied to the non-conductive body via physical vapor deposition, chemical vapor deposition, thermal spraying electroplating and/or another process that is deemed expedient by someone skilled in the art.

Moreover, it is proposed that the field shaping element is mounted on, preferably latched to an, in particular the already aforementioned, electric component, in particular to the further field shaping element. A particularly simple and convenient assembly can be made possible. It is advantageously possible to replace field formers particularly easily and quickly. Advantageously, assembly can be carried out without tools. Preferably the field shaping element and the further field shaping element are attached to each other in such a way that the printed circuit board is clamped between the field shaping element and the further field shaping element. Alternatively or additionally, it is also conceivable that the field shaping element is mounted on the electric component in a manner other than a latching action, for example by means of a screwed connection, a riveted connection, a welded connection, an adhesive connection or the like or a combination of these.

The electric field shaper according to the invention, the high-voltage generator according to the invention, the x-ray generator according to the invention and/or the method according to the invention shall herein not be limited to the application and implementation described above. In particular, in order to fulfill a functionality that is described here, the electric field shaper according to the invention, the high-voltage generator according to the invention, the x-ray generator according to the invention and/or the method according to the invention may comprise a number of individual elements, components and units as well as method steps that differs from a number given here. Moreover, concerning the value ranges given in the present disclosure, values within the limits mentioned shall also be considered to be disclosed and to be usable as applicable.

BRIEF DESCRIPTION OF THE SEVERAL VIEWS OF THE DRAWING

Further advantages will become apparent from the following description of the drawing. In the drawing one exemplary embodiment of the invention are illustrated. The drawing, the description and the claims contain a plurality of features in combination. Someone skilled in the art will purposefully also consider the features individually and will find further expedient combinations.

It is shown in.

DETAILED DESCRIPTION OF THE INVENTION

Figure 1:
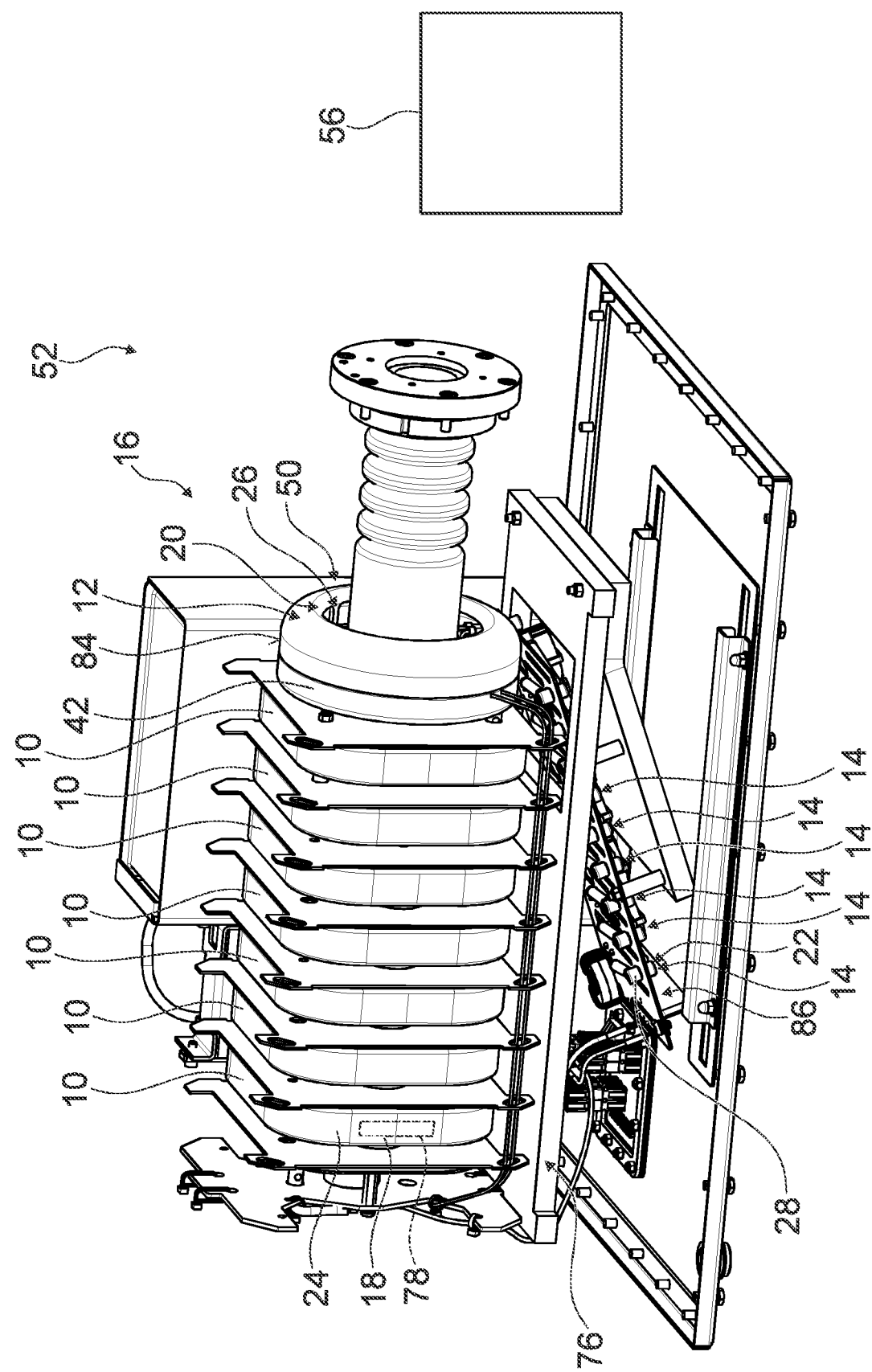
FIG. 1 An x-ray generator according to the invention with a high-voltage generator device according to the invention and an x-ray tube in a schematic representation.

In FIG. 1 an x-ray generator 52 is shown. The x-ray generator 52 comprises a high-voltage generator 16. The x-ray generator 52, in particular the high-voltage generator 16, comprises a high-voltage generator device 50. The x-ray generator 52 comprises an x-ray tube 56. The high-voltage generator 16 is configured to supply the x-ray tube 56 with a high-voltage.

The high-voltage generator device 50 comprises at least a voltage multiplier unit 76. The voltage multiplier unit 76 comprises a multitude of Greinacher circuits 78 (FIG. 1 shows an example of only one of the multitude of Greinacher circuits 78). Alternatively, it is also conceivable that the voltage multiplier unit 76 comprises only one Greinacher circuit 78. The voltage multiplier unit 76 is configured to convert a supplied AC voltage into a high DC voltage. The Greinacher circuits 78 form a cascade, in particular to convert a supplied AC voltage into a high DC voltage.

The high-voltage generator device 50 comprises a multitude of electric field shapers 10 for shaping an electric field. Alternatively, it is also conceivable that the high-voltage generator device 50 comprises only one electric field shaper 10. The electric field shapers 10 are each assigned to one of the Greinacher circuits 78. The electric field shapers 10 each comprise a field shaping unit 18. The field shaping units 18 are configured to shape an electric field of the high-voltage generator 16. The electric field shapers 10 are configured to counteract a local exceeding of a predetermined limit value of the electric field strength of the electric field.

The field shaping units 18 of the electric field shapers 10 each comprise a field shaping element 24. The field shaping elements 24 are each implemented ring-shaped. The field shaping elements 24 each comprise a non-conductive body 30. The non-conductive body 30 consists at least partially of a plastic, particularly at least substantially completely of a plastic. The non-conductive body 30 is a plastic body. Alternatively, it is also conceivable that the non-conductive body 30 consists at least partially of an engineered wood, for example paper, cardboard, plywood, densified wood, fibreboard, particle board or the like or another non-conductive material. The non-conductive bodies 30 each consist at least partially, preferably at least substantially completely, of an electrically non-conductive material. An electrically non-conductive object or material is herein an element or a material which has an electrical conductivity of maximum $5 \cdot 10^{-6}$ S/m in particular at 0° C. It is conceivable that the non conductive bodies 30 each are formed from one material or from multiple materials. It is also conceivable that the non-conductive bodies 30 each consist at least partially of an electrically conductive material. An electrically conductive object or material is herein an element or a material to be understood which has an electrical conductivity which is greater than $5 \cdot 10^{-6}$ S/m, preferably greater than $1 \cdot 10^{5}$ S/m, in particular at 0° C. For example, it is conceivable that the non-conductive bodies 30 each comprise electrically conductive particles or the like. The non-conductive bodies 30 each consist completely of a polycarbonate acrylonitrile butadiene styrene mixture. Alternatively, it is also conceivable that the non-conductive bodies 30 each consist only partially of a polycarbonate acrylonitrile butadiene styrene mixture. For example, alternatively or additionally, it is conceivable that the non-conductive bodies 30 each consist at least partially of another plastic, in particular one that is different from a polycarbonate acrylonitrile butadiene styrene mixture.

The field shaping elements 10 each comprise an electrically conductive coating 32 that is arranged on the respective non-conductive body 30 of the field shaping elements 10. The electrically conductive coatings 32 each are implemented integrally with the respective non-conductive body 30.

The electrically conductive coatings 32 each consist at least partially of electrically conductive materials. Preferably, the electrically conductive coatings 32 each consist at least substantially completely of electrically conductive materials. The electrically conductive coatings 32 each have an electrical conductivity which is greater than $5 \cdot 10^{-6}$ S/m, particularly preferable greater than $1 \cdot 10^{5}$ S/m, in particular at 0° C. Alternatively, it is also conceivable that the electrically conductive coatings 32 each consist at least substantially completely of only one electrically conductive material. Additionally, it is also conceivable that the electrically conductive coatings 32 each comprise one electrically non-conductive material or several electrically non-conductive materials in addition to the electrically conductive materials.

The electrically conductive coatings 32 each cover the respective non-conductive body 30 at least substantially completely. The electrically conductive coatings 32 each comprise several electrically conductive layers, in particular several metal layers. The respective individual layers of the electrically conductive layers are formed from materials different from each other. Alternatively, it is also conceivable that the respective individual layers of the electrically conductive layers differ at least in a material composition. Furthermore, it is alternatively conceivable that the individual layers of the respective electrically conductive layers are formed from the same material and/or have the same material composition.

The electrically conductive coatings 32 each are implemented as metal coatings. The electrically conductive layers each are metal layers. Alternatively, it is also conceivable that the electrically conductive coatings 32 each comprise only one electrically conductive layer. The electrically conductive coatings 32 each are formed by the several electrically conductive layers or alternatively by the only one electrically conductive layer. It is additionally conceivable that the electrically conductive coatings 32 each comprise at least one electrically non-conductive layer. Each of the several electrically conductive layers covers the respective non-conductive body 30 at least substantially completely. The electrically conductive layers of each of the electrically conductive coatings 32 are arranged on top of each other. At least one electrically conductive layer of the respective electrically conductive layers lies in particular against the respective non-conductive body 30. At least one further electrically conductive layer of the respective electrically conductive layers is arranged at a distance from the respective non-conductive body 30.

The electrically conductive coatings 32 each comprise at least one copper layer for receiving an electric charge. The copper layers each lie directly against the respective non-conductive body 30. The copper layers each are at least configured to compensate for possible unevenness of a surface of the respective non-conductive body 30 on which the respective copper layer is arranged. The copper layers in particular each have a thickness of at least 15 µm. The copper layers each have a thickness between 15 µm and 25 µm. Alternatively, it is also conceivable that the copper layers each have a thickness smaller than 15 µm or greater than 25 µm.

The electrically conductive coatings 32 each comprise at least one nickel layer. The nickel layers each are intended as a corrosion protection, for example. The copper layers are each arranged between the respective non-conductive body 30 and the respective nickel layer. The nickel layers each cover the respective copper layer and the respective non-conductive body 30 at least substantially completely. The nickel layers 30 each lie directly against the respective copper layer. The nickel layers each have a thickness of at least 5 µm. The nickel layers each have a thickness between 5 µm and 15 µm. Alternatively, it is also conceivable that the nickel layers each have a thickness smaller than 5 µm or greater than 15 µm.

The electrically conductive coatings 32 each comprise at least one layer containing chromium for scratch protection. The nickel layers are each configured for bonding of the respective copper layer to the respective layer containing chromium. The layers comprising chromium each consist completely of chromium. Alternatively, it is also conceivable that the layers containing chromium each consist partially of chromium. The layers containing chromium are different from the respective nickel layers and/or the copper layers. Alternatively, it is also conceivable that the layers containing chromium correspond to the respective nickel layers or to the respective copper layers. The layers containing chromium each are the outermost layer of the respective electrically conductive coating 32, preferably when viewed from the respective non-conductive body 30. The nickel layers and/or the copper layers each are arranged between the respective plastic body 30 and respective the layers containing chromium. The layers containing chromium each cover the respective copper layer, the respective nickel layer and/or the respective non-conductive body 30 at least substantially completely. The layers containing chromium each lie directly against the respective nickel layer. The layers containing chromium each have a thickness of at least 0.1 µm. The layers containing chromium each have a thickness between 0.1 µm and 0.5 µm. Alternatively, it is also conceivable that the layers containing chromium each have a thickness smaller than 0.1 µm or greater than 0.5 µm.

The field shaping units 18 each comprise an at least substantially uniform outward-facing surface 34. The outward-facing surfaces 34 of the field shaping units 18 each are formed without edges. The outward-facing surfaces 34 of the field shaping units 18 each are free of protrusions and/or recesses that are visible to the naked eye. The field shaping elements 24 each comprise an outward-facing surface 72 which corresponds to the outward-facing surface 34 of the respective field shaping unit 18. It is also conceivable that at least a part of each of the outward-facing surfaces 72 of the field shaping elements 24 each correspond to at least a part of the outward-facing surface 34 of the respective field shaping unit 18. The outward-facing surfaces 34 each are arranged on a side of the respective field shaping unit 18 facing away from a geometric center of the respective field shaping unit 18. An outward-facing surface 72 of each of the field shaping elements 24 corresponds to the outward-facing surface 34 of the respective field shaping unit 18.

Figure 2:
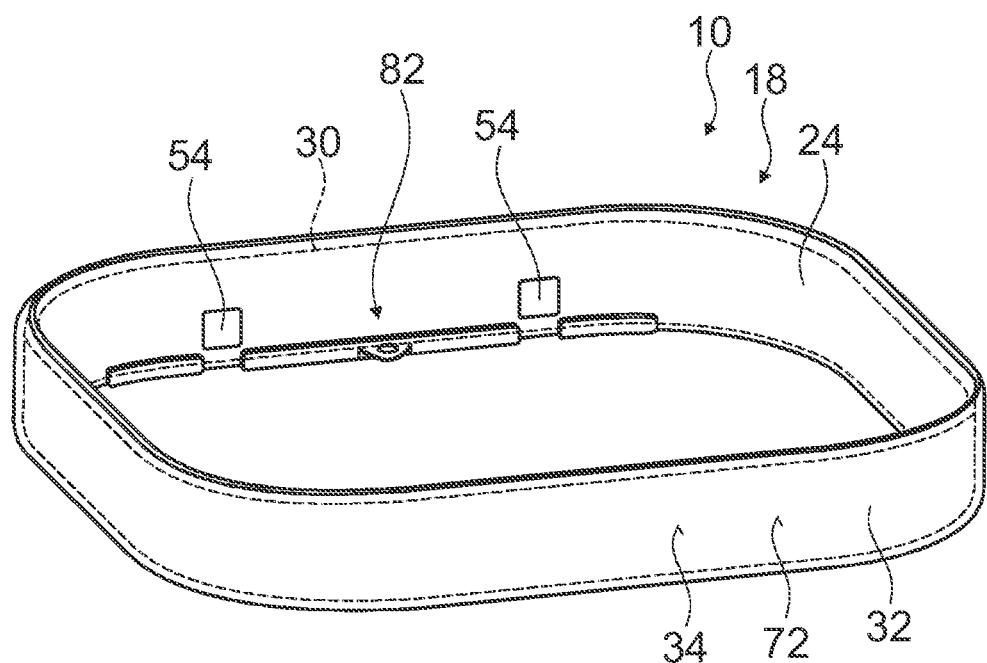
FIG. 2 An electric field shaper according to the invention of the high-voltage generator device in a perspective representation.

The field shaping elements 24 each comprise four rigid connection elements 54 for fastening of an electric component, in particular of one of each of the Greinacher circuits 78 (FIG. 2 shows only two of the four rigid connection elements). The Greinacher circuits 78 each are arranged on an inner side 82 of the respective field shaping unit 18. The Greinacher circuits 78 are each electrically connected to one of each of the field shapers 10, in particular to one of each of the field shaping elements 24, preferably on the inner side 82 of the respective field shaping unit 18. Thus, in an operation state the electrically conductive coating 32 is on an electric potential of at least 100 V. The rigid connection elements 54 each are configured for a deflection-free fastening, in particular with respect to the respective rigid connection elements 54, of the respective Greinacher circuit 78. The rigid connection elements 54 are each formed by a part of the respective non-conductive body 30 and a part of the respective electrically conductive coating 32. The rigid connection elements 54 are implemented as latching elements, in particular as latching lugs. Alternatively, it is also conceivable that the rigid connection elements 54 are implemented as latching elements of a bayonet mount, as recesses or the like.

The rigid connection elements 54 each are arranged on a side of the respective electric field shaping element 24 which corresponds to a low electric field strength side of the field shaping element 24 at least in one operation state. A maximum potential difference on the low electric field strength side of the field shaping element 24 is for example maximum 50 kV in at least one operation state. Alternatively, it is also conceivable that a maximum value of a maximum potential difference on the low electric field strength side is different from 50 kV, for example smaller or larger. The elastic connection elements 54 are arranged in such a way that in at least one operation state an electric potential in an area in which the respective elastic connection element 54 is arranged is at least substantially constant in that operation state. The inner sides 82 of the respective field shaping units 18 each correspond to the low electric field strength side of the respective field shaping element 24.

Figure 3:
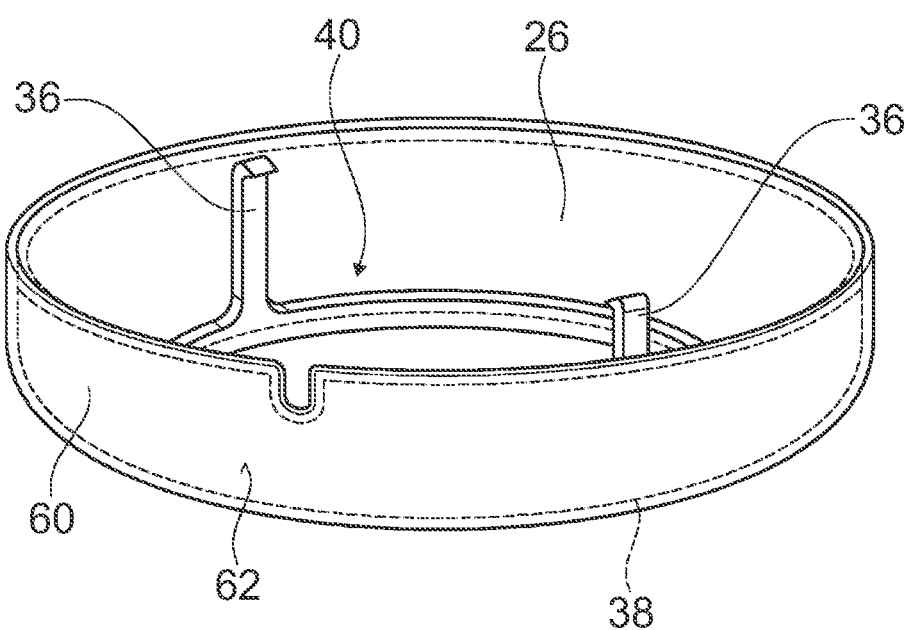
FIG. 3 A field shaping element of a further electric field shaper of the high-voltage generator device in a perspective representation.

The high-voltage generator device 50 comprises at least one further electric field shaper 12 for shaping an electric field. In particular, the description of the electric field shapers 10, except for differences described, applies analogously to the further field shaper 12. The further electric field shaper 12 is circle-shaped. The further electric field shaper 12 comprises at least one field shaping unit 20. The field shaping unit 20 comprises a field shaping element 26 (see FIG. 3). The field shaping element 26 comprises a non-conductive body 38. The field shaping element 26 comprises an electrically conductive coating 60 that is arranged on the non-conductive body 38. The field shaping unit 20 comprises one further field shaping element 42. The field shaping element 26 and the further field shaping element 42 are at least in one operation state attached to each other. The field shaping unit 20 comprises an at least substantially uniform outward facing surface 84, in particular except for a transition area between the field shaping element 26 and the further field shaping element 42 in a state of being attached to each other.

The field shaping element 26 comprises two elastic connection elements 36 for fastening of an electric component (not shown here). Alternatively, it is also conceivable that the field shaping element 26 comprises only one elastic connection element 36 or more than two elastic connection elements 36. The elastic connection elements 36 are configured to be deflected for fastening of the electric component.

The elastic connection elements 36 are formed by a part of the non-conductive body 38 and a part of the electrically conductive coating 60. The elastic connection elements 36 are implemented as latching elements, in particular as latching hooks. Alternatively, it is also conceivable that the elastic connection elements 36 are implemented as elastic clamping elements or any other elastic connection element that is deemed expedient by someone skilled in the art.

The elastic connection elements 36 are arranged on a side of the respective electric field shaping element 26 which corresponds to a low electric field strength side of the field shaping unit 20 in at least in one operation state. A maximum potential difference on the low electric field strength side of the field shaping element 26 is maximum 50 kV in at least one operation state. The elastic connection elements 36 are arranged in such a way that in at least one operation state an electric potential in an area in which the respective elastic connection element 36 is arranged is at least substantially constant in that operation state.

The elastic connection elements 36 are arranged on an inner side 40 of the field shaping unit 20 of the further electric field shaper 12. The inner side 40 of the field shaping unit 20 corresponds to the low electric field strength side of the field shaping unit 20. The inner side 40 of the field shaping unit 20 is different from a side on which an outward-facing surface 62 of the field shaping unit 20 is arranged.

Figure 4:
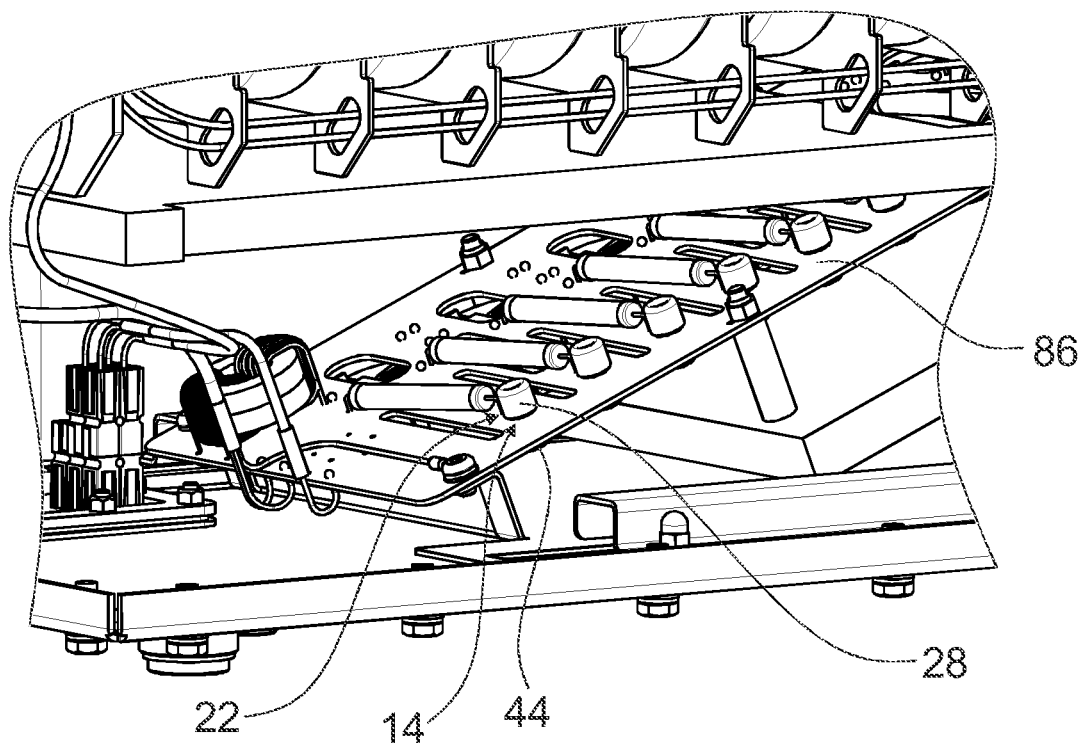
FIG. 4 A section of FIG. 1 with a printed circuit board of the high-voltage generator device with a multitude of additional electric field shapers.
Figure 5:
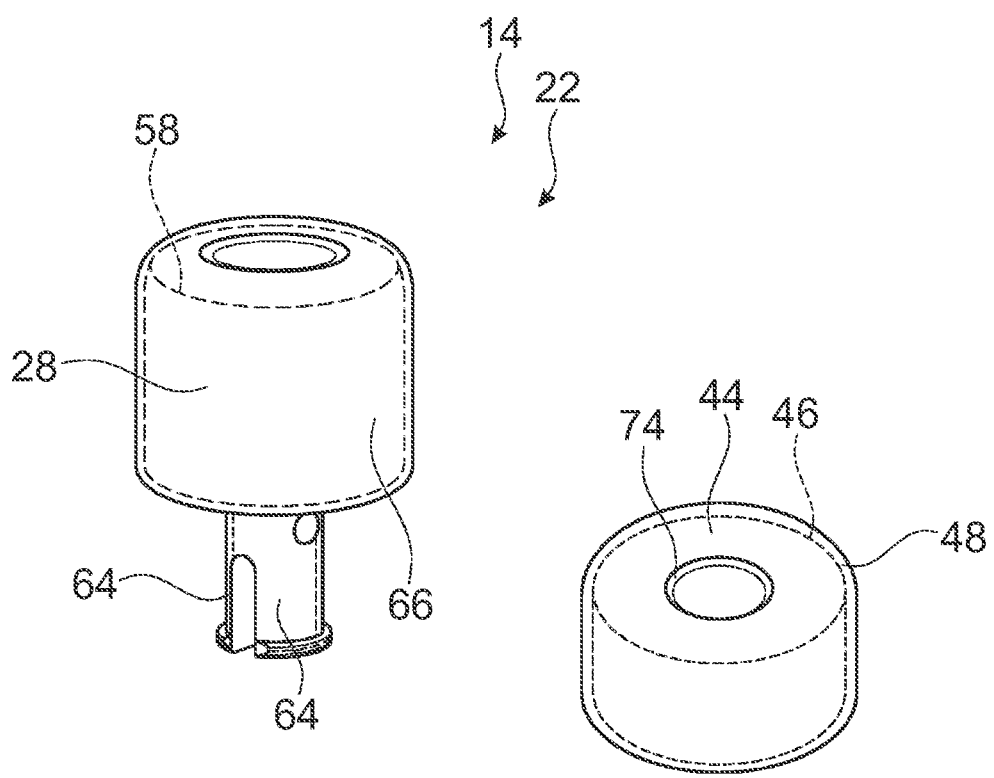
FIG. 5 One of the additional electric field shapers from FIG. 4 in a disassembled state.

The high-voltage generator device 50 comprises a multitude of additional electric field shapers 14 for shaping an electric field (in FIG. 4, only one of the additional field shapers 14 is provided with a reference numeral). In particular, the description of the electric field shapers 10, except for differences described, applies analogously to the additional field shapers 14. Alternatively, it is also conceivable that the high-voltage generator device 50 comprises only one additional electric field shaper 14. The additional electric field shapers 14 each comprise at least one field shaping unit 22 (in FIG. 1 only one of the field shaping units 22 is indicated with a reference number). The field shaping units 22 each comprise a field shaping element 28. Each of the field shaping elements 28 comprises a non-conductive body 58. The field shaping elements 28 each comprise an electrically conductive coating 66 that is arranged on the respective non-conductive body 58 (see FIG. 5).

The respective field shaping units 22 each comprise a further field shaping element 44. The further field shaping elements 44 each comprise a further non-conductive body 46. The further field shaping elements 44 each comprise a further electrically conductive coating 48. The further electrically conductive coatings 48 are arranged on the respective further non-conductive body 46. The field shaping elements 28 and the further field shaping elements 44 are each attachable to each other. The field shaping elements 28 and the further field shaping elements 44 are implemented as corresponding plug parts. The high-voltage generator device 50 comprises at least one printed circuit board 86. The printed circuit board 86 comprises a multitude of recesses to accommodate the additional field shapers 14. The printed circuit board 86 comprises at least one electrically conductive component, which is electrically connected to the additional field shapers 14.

The field shaping elements 28 and the further field shaping elements 44 are each at least in one operation state attached to each other to shape the electric field. The field shaping elements 28 are formed corresponding to the further field shaping elements 44. The field shaping elements 28 and the further field shaping elements 44 are each detachably, in particular non-destructively detachably, attachable to each other. A material composition of the further non-conductive bodies 46 corresponds to a material composition of the non-conductive bodies 58. Alternatively, it is also conceivable that the material composition of the further non-conductive bodies 46 is different from the material composition of the non-conductive bodies 58. In particular, a material composition of the further electrically conductive coatings 48 corresponds to a material composition of the electrically conductive coatings 66. Alternatively, it is also conceivable that the material composition of the further electrically conductive coatings 48 is different from the material composition of the electrically conductive coatings 66.

The electrically conductive coatings 66 each have electrically conductive layers. The further electrically conductive coatings 48 each have electrically conductive layers. Thicknesses of the electrically conductive layers of the further electrically conductive coatings 48 are analogous to thicknesses of the electrically conductive layers of the electrically conductive coatings 66. Alternatively, it is also conceivable that the thicknesses of the electrically conductive layers of the further electrically conductive coatings 48 are different from the thicknesses of the respective electrically conductive layers of the electrically conductive coatings 66.

The field shaping elements 28 each comprise two elastic connection elements 64 for fastening one of each of the further field shaping elements 44. The elastic connection elements 64 of the field shaping elements 28 are each implemented correspondingly to the further field shaping elements 44. For example, the further field shaping elements 44 each comprise a rigid connection element 74. The elastic connection elements 64 of the field shaping element 28 are configured to work together with the respective rigid connection element 74 of the further field shaping elements 44 for fastening the field shaping elements 28 and the respective further field shaping element 44 to each other.

Figure 6:
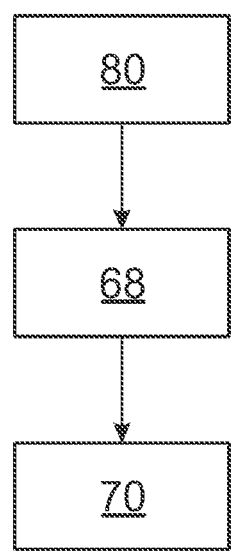
FIG. 6 A schematic flow chart of a method for manufacturing an electric field shaper.

FIG. 6 shows a schematic flow chart of a method for manufacturing one of the additional electric field shapers 14, in particular one of the field shaping elements 28. The description of the method applies analogously to the manufacturing of the electric field shapers 10 and the further electric field shaper 12.

In one process step 80 the non-conductive body 58 is manufactured by injection molding or another process that is deemed expedient by someone skilled in the art.

In one process step 68, in particular in a coating step, the electrically conductive coating 66 is applied to the non-conductive body 58 of the field shaping element 28. In the coating step the electrically conductive coating 66 is applied to the non-conductive body 58 via physical vapor deposition, chemical vapor deposition, thermal spraying, electroplating and/or another process that is deemed expedient by someone skilled in the art.

In one process step 70, in particular an assembly step, the field shaping element 28 is mounted on, in particular latched to, an electric component, in particular to one of the further field shaping elements 44. The printed circuit board 86 is clamped between the field shaping element 28 and the respective further field shaping element 44. Alternatively or additionally, it is also conceivable that the field shaping element 28, is mounted on the electric component in a manner other than a latching action, for example by means of a screwed connection, a riveted connection, a welded connection, an adhesive connection or the like or a combination of these.

REFERENCE NUMERALS

10 Electric field shaper
12 Electric field shaper
14 Electric field shaper
16 High-voltage generator
18 Field shaping unit
20 Field shaping unit
22 Field shaping unit
24 Field shaping element 26 Field shaping element
28 Field shaping element
30 Non-conductive body
32 Electrically conductive coating
34 Outward-facing surface
36 Elastic connection element
38 Non-conductive body
40 Inner side
42 Field shaping element
44 Field shaping element
46 Non-conductive body
48 Electrically conductive coating
50 High-voltage generator device
52 X-ray generator
54 Rigid connection element
56 X-ray tube
58 Non-conductive body
60 Electrically conductive coating
62 Outward-facing surface
64 Elastic connection element
66 Electrically conductive coating
68 Process step
70 Process step
72 Outward-facing surface
74 Rigid connection element
76 Voltage multiplier unit
78 Greinacher circuit
80 Process step
82 Inner side
84 Outward-facing surface
86 Printed circuit board

The invention claimed is:

1. A high-voltage generator device comprising:
an electric field shaper for shaping an electric field;
the electric field shaper comprising at least one field shaping unit, which has a field shaping element; and
wherein the field shaping element comprises a non-conductive plastic body and an electrically conductive coating that is arranged on the non-conductive body, and wherein the absolute value of an electric potential of the electrically conductive coating is in an operation state at least 100 V.

2. The high-voltage generator device according to claim 1, wherein the electrically conductive coating covers the non-conductive body at least substantially completely.

3. The high-voltage generator device according to claim 1 wherein the electrically conductive coating comprises several electrically conductive metal layers.

4. The high-voltage generator device according to claim 1 wherein the electrically conductive coating comprises at least one copper layer for receiving an electric charge.

5. The high-voltage generator device according to claim 1 wherein the electrically conductive coating comprises at least one nickel layer for bonding the non-conductive body to an electrically conductive layer of the electrically conductive coating or for bonding an electrically conductive layer of the electrically conductive coating to a further electrically conductive layer of the electrically conductive coating.

6. The high-voltage generator device according to claim 1 wherein the electrically conductive coating comprises at least one layer containing chromium for scratch protection.

7. The high-voltage generator device according to claim 1 wherein the field shaping unit comprises an at least substantially uniform outward-facing surface.

8. The high-voltage generator device according to claim 1 wherein the field shaping element comprises at least one elastic connection element, which is arranged on an inner side of the field shaping unit for fastening of an electric component.

9. The high-voltage generator device according to claim 1 wherein the field shaping unit comprises a further field shaping element, which has a further non-conductive body and a further electrically conductive coating that is arranged on the further non-conductive body, wherein the field shaping element and the further field shaping element are attachable to each other.

10. The high-voltage generator device according to claim 1 wherein the non-conductive body consists at least partially of a polycarbonate acrylonitrile butadiene styrene mixture.

11. The high-voltage generator device according to claim 1 wherein an inside of the field shaping element is free from any electric and/or electronic components.

12. An X-Ray generator comprising a high-voltage generator device according to claim 1.

13. A method for manufacturing a high-voltage generator device comprising:
providing an electric field shaper for shaping an electric field, the electric field shaper comprising at least one field shaping unit, which has a field shaping element comprising a non-conductive body; and
applying an electrically conductive coating to the non-conductive body, wherein the absolute value of an electric potential of the electrically conductive coating is in an operation state at least 100 V.

14. The method according to claim 13, mounting the field shaping element to an electric component.

15. The high-voltage generator device according to claim 2 wherein the electrically conductive coating comprises several electrically conductive metal layers.

16. The high-voltage generator device according to claim 3 wherein the electrically conductive coating comprises at least one copper layer for receiving an electric charge.

17. The high-voltage generator device according to claim 3 wherein the electrically conductive coating comprises at least one nickel layer for bonding the non-conductive body to an electrically conductive layer of the electrically conductive coating or for bonding an electrically conductive layer of the electrically conductive coating to a further electrically conductive layer of the electrically conductive coating.

18. The high-voltage generator device according to claim 3 wherein the electrically conductive coating comprises at least one layer containing chromium for scratch protection.

19. The high-voltage generator device according to claim 3 wherein the field shaping unit comprises an at least substantially uniform outward-facing surface.

* * * * *